United States Patent [19]

Tamura et al.

[11] Patent Number: 4,841,143
[45] Date of Patent: Jun. 20, 1989

[54] CHARGED PARTICLE BEAM APPARATUS

[75] Inventors: Hifumi Tamura, Hachioji; Hiroyasu Shichi; Kaoru Umemura, both of Kokubunji, all of Japan

[73] Assignee: Hitachi, Ltd., Tokyo, Japan

[21] Appl. No.: 160,408

[22] Filed: Feb. 25, 1988

[30] Foreign Application Priority Data

Feb. 27, 1987 [JP]  Japan .................. 62-42551

[51] Int. Cl.$^4$ ........................... H01J 37/256
[52] U.S. Cl. ...................... 250/288; 250/304; 250/306; 250/399; 250/397
[58] Field of Search .............. 250/288, 309, 399, 306, 250/397

[56] References Cited

U.S. PATENT DOCUMENTS

| | | | |
|---|---|---|---|
| 4,266,127 | 5/1981 | Chang | 250/288 |
| 4,479,060 | 10/1984 | Tamura et al. | 250/398 |
| 4,564,758 | 1/1986 | Slodzian et al. | 250/309 |
| 4,740,697 | 4/1988 | Suzuki | 250/309 |

FOREIGN PATENT DOCUMENTS 52-21911  6/1977  Japan .

Primary Examiner—Jack I. Berman
Attorney, Agent, or Firm—Antonelli, Terry & Wands

[57] ABSTRACT

A charged particle beam apparatus is disclosed, which comprises a charged particle source; focusing means for focusing a charged particle beam emitted by the charged particle source on a sample and irradiating it therewith; deflecting means for deflecting the charged particle beam so as to scan the sample therewith; secondary ion separating means disposed approximately symmetrically with respect to the axis of the charged particle beam at the proximity of said sample and separating positive and negative secondary ions generated by the irradiation of the sample into positive and negative ions; and mass analyzers for analyzing the mass of the separated positive and negative secondary ions, respectively.

8 Claims, 2 Drawing Sheets

CHARGED PARTICLE BEAM APPARATUS

BACKGROUND OF THE INVENTION

This invention relates to a charged particle beam apparatus and in particular to a charged particle beam apparatus capable of contributing remarkably to the improvement of the precision of analysis in the secondary ion mass spectrometry.

This kind of prior art apparatuses detected secondary ions by means of a single mass spectrometer, and described in JP-B-52-21911, and it was difficult to detect simultaneously both positive and negative secondary ions. Further they were not provided with a successive observation function with high resolving power for a sample surface in a state, where it is progressively etched from one minute to the next.

Heretofore, since positive and negative ions were detected independently and both positive and negative ions emitted by a same origin were not detected simultaneously, it was difficult to identify the state of molecules or the state of compounds of the sample. Further it is known that the positive secondary ionization rate is high for electropositive elements and the negative secondary ionization rate is high for electronegative elements and in order to analyze all the elements with a high sensitivity, it is an inevitable analysis technique to detect simultaneously both positive and negative secondary ions, but there are known no prior art techniques for realizing it.

Further, heretofore, an optical microscope having a low resolving power was used for the observation of a domain to be analyzed. This method was insufficient for the observation of a submicron domain and the high precision positioning of the location to be analyzed. Further, for the analysis in the direction of the depth utilizing sputtering phenomena, it is important to take-out composite information of the observation of the sample surface and the result of the analysis and to effect overall characterization by monitoring continuously the etching shape and depth while observing successively the etched surface. It can be said that this is an inevitable technique particularly for the analysis of extremely small areas.

Furthermore, also for the microfabrication technique the selection of the location to be fabricated, the non-destructive and precise positioning method for the location to be fabricated, and the method for successive observation of the shape of fabrication are important, as described previously. There existed no prior art techniques, which can deal with such problems.

SUMMARY OF THE INVENTION

The object of this invention is to provide a charged particle beam apparatus capable of detecting simultaneously positive and negative secondary ions the analysis or the fabrication so as to improve the precision of the analysis.

The object described above is achieved by adopting the following new techniques.

Firstly a method for detecting simultaneously positive and negative secondary ions will be explained. The fundamental conception of the method for detecting simultaneously positive and negative secondary ions consists in locating deflecting electrodes, which are symmetric with respect to a plane including the beam axis, at the neighborhood of the sample in order to keep the central optical axis of the primary ion beam at zero potential, to which electrodes positive and negative voltages are applied, respectively, so that positive and negative secondary ions are taken-out, separated from each other so as to lead them to different analyzers.

A second method relates to the high resolving power successive observation method by making the function of a scanning electron microscope (SEM) multiplex. As relating prior art techniques an ionelectron hybrid beam source and a hybrid deflecting system have been developed. This invention utilizes a part of these techniques. That is, the realization of the SEM depends on the method in which electrons emitted almost simultaneously with secondary ions having large masses are extracted without interference. The fundamental principle, which enables selective electron extraction, consists in utilizing the property that the deflection of charged particles traveling in a magnetic field varies, depending on their mass. Concretely speaking, the object stated above is realized by applying a magnetic field, which is so weak that it has no influences on secondary ions, to the neighborhood of the sample so as to take-out only emitted electrons in the direction perpendicular to the ion extraction direction.

Operation of the deflecting electrodes for extracting both positive and negative secondary ions: The deflecting electrodes are composed of two parallel plates, each of which has an aperture or mesh for extracting secondary ions at a part thereof and to which the same voltages having opposite polarities are applied. The medium plane between the deflecting electrodes, i.e. the plane including the axis of the primary ion beam forms a no-electric field space. In such a state secondary ions generated by the irradiation with primary ions are subjected to the action of the deflecting electrodes described above so that positive secondary ions are attracted by the negative deflecting electrode and negative secondary ions are attracted by the positive deflecting electrode. They are led through the apertures or apertures which mesh formed at a part of the deflecting electrodes to mass spectrometers. In this way the secondary ions are separated into positive and negative ions and led simultaneously to the mass spectrometers, where they are detected.

Means for separating and detecting secondary electrons and working principle thereof: In the beam irradiation system an ion-electron hybrid beam source and a hybrid deflecting system are adopted as a beam source. An ion beam and an electron beam are projected time-sequentially, being superposed or independently to the sample. For this reason, in order to obtain an SEM image, it is necessary to detect secondary electrons and secondary ions while separating them from each other. The detection of the secondary electrons is effected by superposing a weak magnetic field having the same direction as the deflecting electric field thereon, applying it to the extracted secondary ion beam, and extracting them in the direction perpendicular to that of the secondary ion extraction. In this way it is possible to detect secondary electrons in the form of image signals, directed against element analysis, distinguished from positive and negative ions and at the same time independently as well as simultaneously therewith.

DESCRIPTION OF THE PREFERRED EMBODIMENTS

Figure 1:
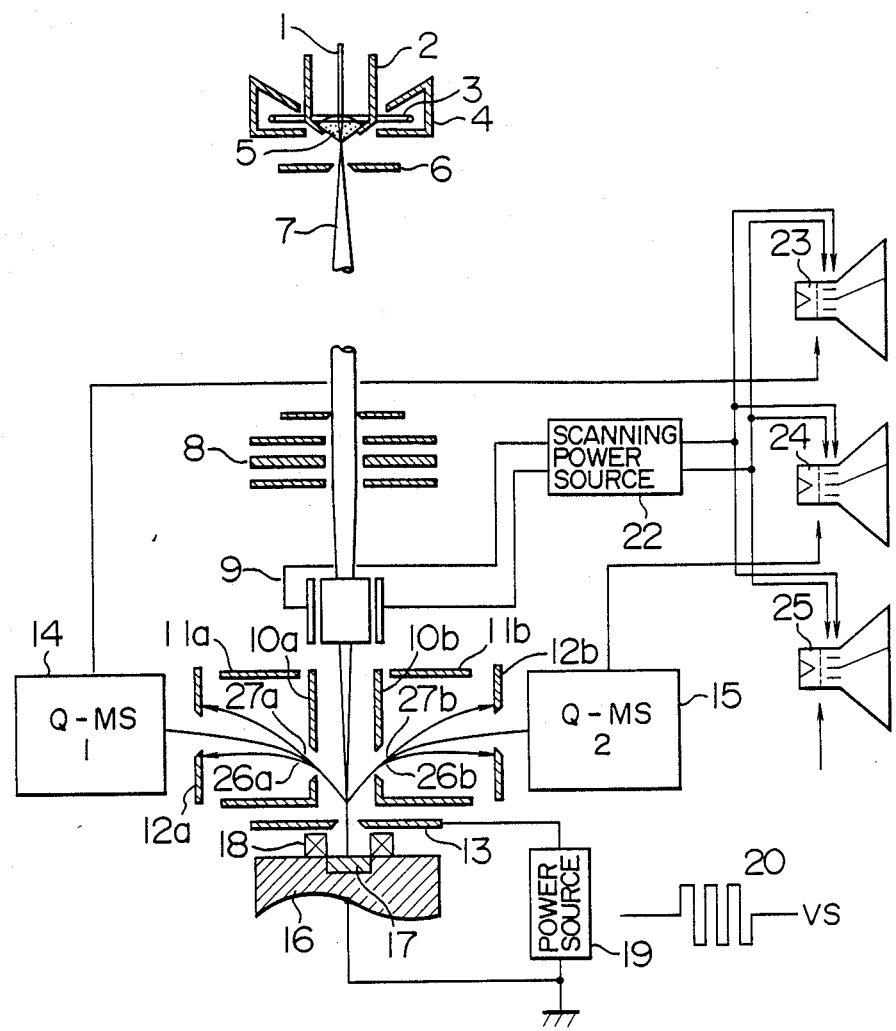
FIG. 1 is a scheme illustrating the construction of the charged particle beam apparatus, which is an embodiment of this invention.
Figure 2:
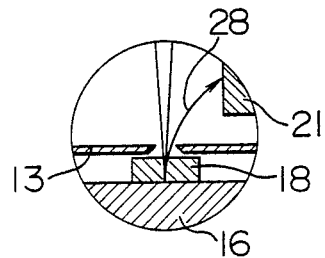
FIG. 2 is a partial side view of the charged particle beam apparatus illustrated in FIG. 1.

Hereinbelow an embodiment of this invention will be explained, referring to FIGS. 1 and 2.

An apparatus according to this invention consists principally of a primary beam projecting system, an image observation system and a secondary beam optical system. The primary beam projecting system is composed of a hybrid beam source both for ions and for electrons and a group of beam focusing lenses, both of which have been already well known. The hybrid beam source is constructed by an emitter tip 1, a reservoir 2, a filament 3, a control electrode 4, beam source material 5 and a charged particle extracting electrode 6. The focusing lens section utilizes a hybrid lens group 8 combining magnetic and electric fields so that the magnetic lens and the electrostatic lens act independently on the charged particle beam (e.g. refer to U.S. Pat. No. 4,479,060). The image observation system is constructed by three CRT 23,24,25 for visualizing images obtained by scanning and a scanning power source 22.

The secondary beam optical system plays the role of extracting positive secondary ions 27a, negative secondary ions 27b and secondary electrons generated on a sample 17, independently from each other. The secondary beam system consists of a hybrid deflector 9 using electrostatic and magnetic fields, driven by the scanning power source 22; electrostatic secondary deflectors 10a, 10b, each of which includes an aperture or metal mesh 26a, 26b for separating secondary ions into positive and negative ions and extracting them; energy analyzers 11a, 11b for effecting energy analysis of the extracted secondary ions 27a, 27b; energy splitting slits 12a, 12b; mass analyzers 14, 15; secondary ion extracting electrodes 13; a sample table 16; a sample 17; a magnetic pole 18 for generating the secondary electron deflecting magnetic field; a secondary electron detector 21 (FIG. 2) and a secondary ion accelerating power source 19. A negative voltage is applied to the secondary ion deflector 10a so as to extract positive secondary ions 27a. On the contrary the secondary ion deflector 27b is so constructed that a positive voltage is applied thereto so as to extract negative secondary ions 27b. In this embodiment quadrupole mass spectrometers are used for the mass analyzers 14 and 15. Output signals of the mass analyzers 14 and 15 are transmitted to the CRTs 23 and 24, respectively, and the output of the secondary electron detector 21 is transmitted to the CRT 25. A DC or pulsed voltage 20 is used as the secondary ion accelerating voltage.

Now the operation of the secondary beam system will be explained. A charged particle beam 7 including both ions and electrons and generated by the hybrid beam source 1 to 6 is focused by a hybrid lens group 8 into a fine beam and projected to the sample 17. The surface of the sample irradiated with the beam emits positive and negative secondary ions 27a, 27b and secondary electrons. The emitted secondary ions 27a, 27b are separated by the deflecting electric field produced by the deflecting electrodes 10a, 10b into positive ions 27a and negative ions 27b and led through the apertures 26a, 26b formed in the deflecting electrodes to the mass analyzer 14, 15. In this case, the ions led to the mass analyzer 14, 15 are restricted to those having a specified energy by the energy analzyer 11a, 11b and the mass separating slits 12a, 12b. The ions 27a, 27b led to the mass analyzer 14, 15 are massseparated and detected as specified ions.

Secondary electrons 28 generated by the irradiation with the primary beam 7 are deflected by a weak magnetic field produced by a permanent magnet or coil 18 for generating the magnetic field disposed at the proximity of the sample 17 (the secondary ions 27a, 27b are not deflected) and detected by a secondary electron detector 21.

In this way it is possible to detect separately positive secondary ions 27a, negative secondary ions 27b and secondary electrons.

Figure 3:
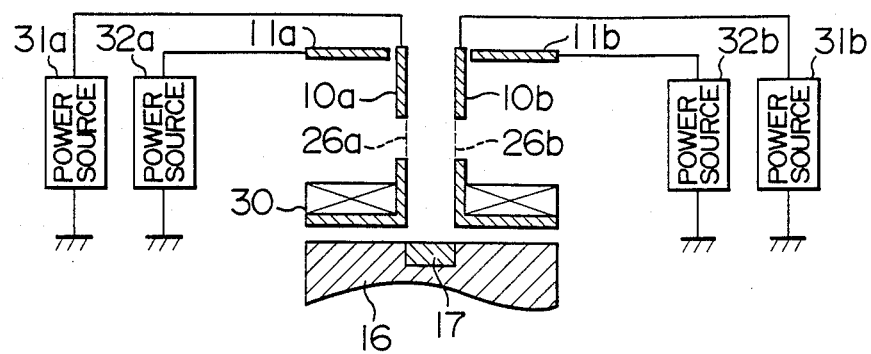
FIG. 3 is a scheme illustrating partially the construction of the charged particle beam apparatus, which is another embodiment of this invention.

FIG. 3 shows another embodiment of this invention, in which a coil 30 generating a magnetic field for deflecting secondary electrons is disposed in a portion including the energy analyzers 11a, 11b. In the figure there are indicated power sources 31a, 31b for the deflecting electrodes 10a, 10b and power sources 32a, 32b for the energy analyzer 11a, 11b. In this embodiment also secondary electrons could be separated efficiently just as in the preceding embodiment.

Figure 4:
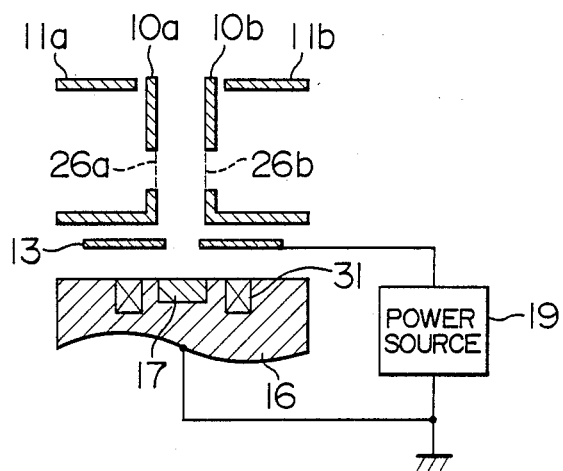
FIG. 4 is a scheme illustrating partially the construction of the charged particle beam apparatus, which is still another embodiment of this invention.

FIG. 4 shows still another embodiment of this invention, in which a permanent magnet or coil 31 is buried in the sample table 16. In this embodiment also it is possible to separate efficiently secondary electrons.

The function described above is equally efficient under three conditions that positive ions and negative ions or electrons are projected independently as the primary beam, that they are projected as a composite beam, and that they are projected sequentially.

The method for determining a domain to be analyzed in a non-destructive manner and the successive observation technique for observing the domain to be analyzed are realized by utilizing the following techniques. At first only the electrostatic lens in the hybrid lens group 8 is driven (i.e. the magnetic lens is not used) so that ions and electrons are extracted in the form of pulses or sequentially from the hybrid beam source. At the same time a hybrid lens voltage is applied to the hybrid lens in synchronism with the extraction of the ion on electron beam while regulating the hybrid lens so that the beam is focused on the sample. Next the hybrid deflecting system 9 is driven only for the magnetic deflection and the electron beam is swept while leaving the ion beam fixed so as to form a secondary electron image on a CRT (cathode ray tube) 25. On the other hand it is also possible to extract the electron or ion beam alone from the hybrid beam source by applying an extraction voltage thereto. The formation of the secondary electron image described above is possible by the irradiation either with the electron beam or with the ion beam and therefore they can be used as required. In this case, since the initial energy of electrons is small for the secondary electron image obtained by using an electron beam, it has a resolving power, which is higher by more than one order of magnitude with respect to that of the secondary electron image obtained by using an ion beam. In this way it is possible to effect an analysis by using an ion beam while observing the state, in which the surface state is varied successively by etching, with a high resolving power SEM image. The domain to be analyzed can be determined precisely, starting from a high resolving power image obtained by using electrons by determining previously the positional relation of the ion beam and the electron beam on the sample. In the case where the destructibility of the sample due to the irradiation with the ion beam is a problematical point, the hybrid beam source is driven at first as the electron source in order to determine the position to be analyzed in a non-destructive manner, while observing a secondary electron image. Then the beam source is driven only as the ion source so as to form an ion beam in order to irradiate the desired position determined previously on the basis of the electron image with the ion beam and to effect a precise positioning.

Although, in the above, some examples of application to the analysis method have been cited as preferred embodiments, also for the microfabrication method by means of an ion beam, the selection of the position to be fabricated while observing an SEM image in a non-destructive manner, the precise positioning and the successive observation at the fabrication have been made possible on the basis of a principle similar to that described above. In this way the fabrication and analysis precision has been remarkably improved.

The effects of this embodiment can be enumerated as follows.

(1) In the case where microfabrication and microarea analysis are effected by using FIB (Focused Ion Beam), it is possible to observe successively the portion of the sample to be fabricated and the domain to be analyzed by means of an SEM and the fabrication and analysis precision can be remarkably increased.

(2) Non-destructive and highly precise positioning of the fabrication and the analysis point are made possible by using an electron beam.

(3) It is possible to observe the three-dimensional structure of the sample by utilizing the etching action due to the ion beam and observing an SEM image by means of the electron beam (three-dimensional SEM).

(4) In the SIMS (Secondary Ion Mass Spectrometer) it is possible to separate positive and negative secondary ions and to detect them simultaneously and thus information concerning compounds, which heretofore it was difficult to obtain, can be obtained.

(5) In the secondary ion extraction system, since the deflecting electric field is applied to the primary beam so that the potential along the axis of the primary beam is kept to zero, positive and negative ions can be separated with a high efficiency without bad influences on the primary beam.

(6) At the fabrication the element analysis and the observation of the portion to be fabricated can be effected simultaneously.

(7) Since a hybrid lens system is adopted, magnetic and electric lenses can be used alone or in combination as required and it is possible to vary independently and arbitrarily the diameter of the ion and electron beams on the sample.

(8) Synchronous scanning with the ion and electron beams is made possible by adopting the hybrid deflecting system and at the same time it is also possible to scan the sample only with the electron beam while leaving the ion beam fixed.

(9) Since there are disposed deflecting electrodes, which are symmetric with respect to a plane including the axis of the primary beam and a positive and a negative voltage are applied thereto, respectively, for separating positive and negative ions so that the potential on the beam axis is zero, it is possible to separate and detect both positive and negative ions without deflecting the primary ion beam.

(10) A secondary electron detection method without influences on secondary ions, utilizing a magnetic field having the mass effect, is adopted as the secondary electron detection method.

(11) At microfabrication it is possible to analyze both positive and negative secondary ions at the same time as the high resolving power observation of the fabricated shape by means of a secondary electron image. In this way it is possible to check the progress of the fabrication and the end thereof.

As explained above, according to this invention, it is possible to detect both positive and negative ions at the same time and to increase the analysis precision.

What is claimed is:

1. A charged particle beam apparatus comprising:
   hybrid charged particle beam source means for emitting a charged particle beam formed of both ions and electrons;
   focusing means for focusing and for enabling irradiation of said charged particle beam emitted by said charged particle beam source means on a sample;
   deflecting means for deflecting said charged particle beam so as to scan said sample;
   secondary ion separating means disposed approximately symmetrically with respect to the axis of said charged particle beam proximate to said sample for separating positive and negative secondary ions generated by the irradiation of said sample into positive and negative ions;
   two mass analyzers for analyzing the mass of said separated positive and negative secondary ions, respectively;
   magnetic field generating means for extracting secondary electrons in a direction perpendicular to the direction, along which said secondary ions are extracted; and
   a secondary electron detector for detecting secondary electrons thus extracted.

2. A charged particle beam apparatus according to claim 1, wherein said two mass analyzers are disposed symmetrically with respect to a plane including the axis of said charged particle beam and said secondary ion separating means comprises deflecting electrodes disposed in a first stage thereof so that said axis of said charged particle beam is disposed therebetween, each of said deflecting electrodes having an aperture, and means for applying voltages of polarities opposite to each other to said deflecting electrodes.

3. A charged particle beam apparatus according to claim 2, wherein said aperture of each of said deflecting electrodes has a mesh-like member.

4. A charged particle beam apparatus according to claim 1, wherein said magnetic field generating means is disposed within a table, on which said sample is located.

5. A charge particle beam apparatus according to claim 1, wherein said magnetic field generation means is disposed proximate to said sample.

6. A charged particle beam apparatus according to claim 1, wherein an extracting electrode for accelerating secondary ions is disposed proximate to said sample, a voltage being applied between said extracting electrode and said sample.

7. A charged particle beam apparatus according to claim 6, wherein said voltage applied between said extracting electrode and said sample is a DC voltage.

8. A charged particle beam apparatus according to claim 6, wherein said voltage applied between said extracting electrode and said sample is a pulsed voltage.

* * * * *